Aug. 3, 1965 L. KATZIN 3,198,990

ELECTRONIC CIRCUIT MODULES HAVING CELLULAR BODIES
AND METHOD OF MAKING SAME

Filed Dec. 1, 1961

LEONARD KATZIN
INVENTOR.

BY Fraser and Bogucki

ATTORNEYS

United States Patent Office 3,198,990
Patented Aug. 3, 1965

3,198,990

ELECTRONIC CIRCUIT MODULES HAVING CELLULAR BODIES AND METHOD OF MAKING SAME

Leonard Katzin, Los Angeles, Calif., assignor, by mesne assignments, to The Bunker-Ramo Corporation, Stamford, Conn., a corporation of Delaware Filed Dec. 1, 1961, Ser. No. 156,448
12 Claims. (Cl. 317—100)

This invention relates to structures and methods for providing electronic circuit assemblies, and more particularly to the provision of compact electronic circuit assemblies in which individual components may readily be replaced.

The "modular" type of construction is being increasingly employed in the fabrication of modern electronic circuit assemblies. In this type of construction a number of individual components including resistors, capacitors, inductors, diodes, transistors, and other active and passive elements are mounted and interconnected in a unitary assembly or module of a selected typical size and configuration. The module may provide a part of a function, a single complete circuit function, or a number of different functions in an over-all system. As the complexity of electronic systems increases, it is important to provide structures which occupy as little physical space as possible. A structure which is of relatively small size is often referred to as having a high component density.

The significant advantages of modular type construction are that high component densities and uniform mechanical and electrical properties can be achieved by mass production techniques.

It has been found that the type of modular construction which provides the highest conventional component density is the "cordwood" type of assembly. In this construction, the generally elongated bodies of the individual components are each mounted parallel to a selected axis, and in side by side relation in each of two dimensions normal to the selected axis. The leads which extend from the ends of the components are therefore substantially parallel and intercouplings may be made between different terminal leads by conductors which lie in a plane which is substantially normal to the selected axis. These intercouplings are sometimes made by printed or etched circuit boards which receive the terminal leads and electrically connect them to other terminal leads which are similarly received. Usually, circuit boards are mounted at each end of the components and connections to other modules are made at one side of the rectangular structure thus formed, or at a number of different external points.

Cordwood modules of the above type have a number of significant disadvantages, however. The use of printed circuit boards effectively encloses the components, and undesirably restricts the dissipation of heat generated in the operation of the components. Further, the unitary structures which are thus formed are usually made in such a way that individual components cannot readily be replaced, so that any faults which arise in an individual module cannot be remedied without disassembly. Furthermore, in order to use suitable mass production techniques, such as dip-soldering, the individual components must be held separately in fixed relation to the circuit boards until a firm joinder is effected. Since the spacing between the circuit boards is controlled by the length of the longest component, with a great disparity between lengths, as often happens, there is a great deal of wasted space within this prior type of module. Perhaps the greatest difficulty with this type of construction, however, arises in maintaining the temperature of the individual components in a suitable range to avoid component failures. Although the circuit assembly may be of relatively small size, much of this advantage is lost where compressors, heat exchangers, heat sinks or convective systems must be used to dissipate the thermal energy which is generated.

A different type of cordwood construction known in the prior art uses welded intercouplings between the components in the module. Although the components are positioned as previously described, conductive ribbons are coupled between selected terminals of the module and are welded to the terminal leads. In order to support the components and to facilitate the welding of the leads, polyethylene or other suitable sheets bearing imprinted patterns which show the connections to be made are inserted over the leads at each end of the module. Where these sheets are thereafter retained in position, the cooling of individual components is restricted and individual components can only be replaced with difficulty, so that it is usually preferred to discard the entire module rather than to attempt correction of any faults which may arise.

It is therefore an object of the present invention to provide an improved form of electronic modular circuit assembly.

Another object of the present invention is to provide an improved type of modular circular assembly which permits a high degree of component density to be achieved.

A further object of the present invention is to provide a novel type of circuit module for electronic assemblies which is light in weight, compact, and permits the individual components to be cooled with high efficiency while the individual components may also be readily replaced.

Another object of the present invention is to provide improved methods of constructing electronic circuit assemblies.

A further object of the present invention is to provide circuit modules having improved combinations of mechanical, electrical and thermal characteristics.

In accordance with one aspect of the present invention, these and other objects are achieved by an assembly employing a cellular body within which individual components are positioned in the cordwood configuration. A particular feature of assemblies in accordance with the invention is the use of a cellular body material which has high thermal conductivity, and the use of a contacting relation between individual components and the cellular body, so that the entire body acts as a heat sink. A further feature is an arrangement which provides open cells so that cooling convective currents may pass through many closely packed modules to reach both the components and the cellular bodies. Interconnections between the extending leads of the various components of a module are made by welded couplings which do not prevent convective flow of the cooling fluid or the dissipation of radiant heat from the components.

In a preferred construction of modules in accordance with the invention, the cellular body is formed of a suitable metallic honeycomb having a thickness which corresponds to a substantial portion of the length of a typical circuit component to be used. The honeycomb is encompassed by an outer conductive frame and an external connector plug is coupled to one side of the frame. The terminal leads of the components extend outwardly from the broad faces of the honeycomb, and welded conductive ribbons are used to interconnect the leads, and to connect the leads to the external connectors. The honeycomb, which may be made, for example, from aluminum, has extremely high strength, even though the individual strips which form the honeycomb may readily be severed so that individual components may be placed in snug contacting relationship with the walls of conforming cells. If an individual component proves faulty, the connections at one or both ends need only be severed and the component may be removed for replacement with a new component. Cooling air is typically blown through the cells of the honeycomb, and superior cooling is provided by the heat sink properties of the honeycomb and also in view of the fact that there is a direct contact between the cooling air and the components. In addition, the entire honeycomb body and frame form a common electrical ground plane, in order that return circuit paths and transient signals are minimized.

In accordance with the method aspects of the invention, desired cell configurations may be formed by the use of a simple cutting tool, and a snug fit is thus achieved merely by inserting a component in position. Furthermore, interconnections which are to be made between separate components may thereafter be indicated on prepared instruction sheets which are inserted over the extending leads of the components. After the welding has been completed, the sheets may be removed as by tearing or through use of an appropriate solvent, leaving the structure and components fully exposed for cooling.

A better understanding of the invention may be had by reference to the following description, taken in conjunction with the accompanying drawing, in which.

Figures 1, 2:
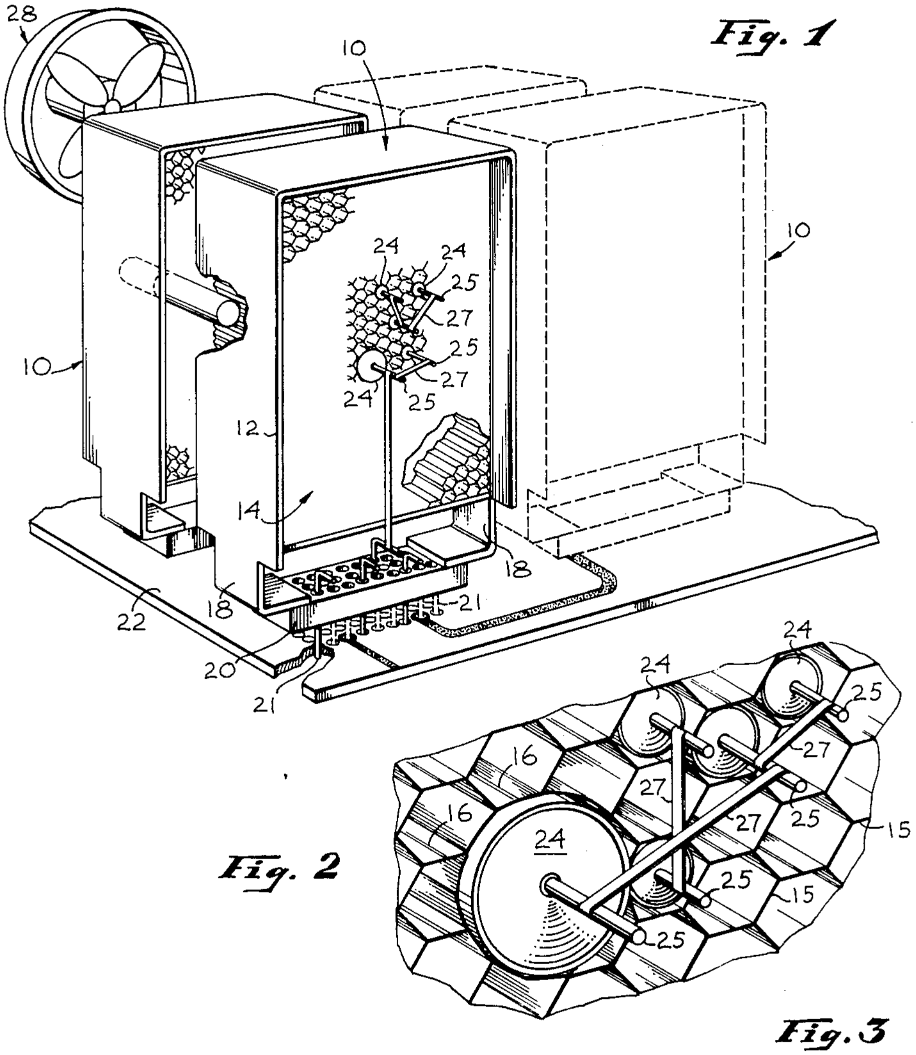
FIG. 1 is a block diagram of a part of an electronic assembly using a modular construction in accordance with the present invention.
FIG. 2 is an enlarged representation of a fragment of the arrangement of FIG. 1, showing the dispositions and interconnections of individual components with a module.

A part of an over-all system employing a modular construction in accordance with the invention is shown in FIG. 1, in which individual modules 10 are mounted in side relation and also in face to face relation. FIG. 1 shows one part only of what may comprise a large three-dimensional unit. Each module 10 includes an encompassing outer frame 12, of generally rectangular form, which is preferably fabricated of aluminum or some other electrically conductive material. Within the frame 12 there is mounted a generally rectangular honeycomb 14, the details of which are seen in the enlarged view of FIG. 2. The broad faces of each honeycomb core are defined by the edges of the thin strips which make up the cell walls 15 of the honeycomb 14. The thin strip have a uniform width, which is of a size corresponding to a substantial portion of the length of the typical component to be used. One readily available honeycomb construction uses a hexagonal configuration, with the points of juncture being along weld lines 16 (FIG. 2). Preferably the honeycomb is of copper, brass or aluminum, which have high thermal conductivity, excellent electrical conductivity and a high degree of strength when formed in this fashion. At the same time, the metallic material of such a honeycomb may readily be served and deformed when handled individually.

At one side of each of the modules 10 is coupled a pair of brackets 18 (FIG. 1) on which a connector plug 20 having extending male or female leads 21 is mounted. Interconnections between the various modules 10 may be made in a number of ways. Here, however, the modules 10 are each mounted in a circuit board 22 in which the conductive interconnections between the modules are established by conventional printing, deposition or etching techniques. A fragment of part of the printed circuit board 22 has been shown as broken away to show the manner in which one end of the illustrated male leads 21 fit into female inserts so that the modules may be mechanically but detachably supported as well as electrically interconnected.

A typical suitable size for the honeycomb 14 is 2⅝" x 2¼" x ½", with the diametral dimension of individual cells being approximately ⅛ inch. With this construction, a maximum of approximately 350 individual units may be disposed within each module. The honeycomb 14 is affixed to the surrounding frame 12 by welding, soldering or through use of a suitable adhesive, to obtain rigidity and good mechanical and electrical connections.

Components 24 are inserted within the different cells of the honeycomb 14. As described in greater detail below, these cells may be considerably enlarged by cutting the cell walls 15, so as to receive larger components. The terminal leads 25 of the components 24 therefore each extend outwardly from the broad faces of the honeycomb 14 and substantially parallel to a selected individual axis. Interconnections between selected component leads are made, for example, by ribbon connectors 27 in well-known fashion. Individual insulated wire conductors may also be used for the interconnections. When done manually, a ribbon connector 27 is coupled to one lead by welding or the like and extended to the other lead to which it is to be joined, where it is also welded. The external lengths of the ribbon connectors and the terminal leads are then trimmed off. As shown, this manner of interconnection also permits the ribbon connectors to lie in different planes and to cross each other as necessary for completion of a particular circuit configuration.

If only a small total volume is available, a three-dimensional structure may be built up of these modules 10 by placing them in separate layers on the same printed circuit boards 22. An external blower 28 may be used, if desired, to force a cooling medium, such as air or any other fluid which is suitable for the purpose, through the cells of the honeycomb 14.

In accordance with the invention, the honeycomb supports the elements firmly but detachably and provides excellent resiliency and protection against shock and vibration. In addition, the structure has virtually no mechanical resonance frequencies, and the common reinforcement of individual lengths which the honeycomb type of structure provides permits great stresses to be undergone without damage. The honeycomb also acts as a heat sink of high efficiency. The direct thermal path which is provided to the body of each component permits high temperatures generated at a component to be dissipated very rapidly by conduction, thus providing substantial cooling. At the same time, however, an extremely high area of open heat sink surface is made available to the cooling medium, and the heat is very rapidly carried away. For these reasons, the cooling medium may for many applications consist only of normal ambient air movement without either forced convection or refrigeration. It is well known that the operative life of many components, particularly active elements such as transistors and various types of diodes, is greatly enhanced if temperature extremes are not encountered. To overcome the problem of temperature, the prior art has often employed special heat sink structures for the individual elements. In accordance with the present invention, however, many of such elements (switching transistors, for example) are adequately cooled by the honeycomb heat sink alone. Other elements which generate a greater amount of heat, such as power transistors, may be incorporated in conjunction with their associated cooling structures directly into the honeycomb.

In addition to the advantages derived from the conductive and convective properties permitted by the honeycomb, the open structure also permits radiant heat to be dissipated substantially without absorption within the module. With these interrelated contributions to superior cooling, a component density may be achieved which is at least several times greater than that heretofore possible. It should also be noted that modules which are in facing relation can very often be placed extremely closely together, because an extending lead of a longer component on one module may pass through an unused part of the honeycomb directly opposing on the module.

A further advantage which results from the construction of the invention is that the entire module serves as an electrical ground plane. Non-magnetic shielding materials, such as silicon steel and the like may be used for the honeycomb where RF currents are apt to be generated during operation, as in video or other high frequency systems.

Where it is not desired to employ an electrical ground plane, of course, the honeycomb core may be one of electrically resistive material, including paper, fiber glass and synthetic fiber cores. The hexagonal honeycomb is advantageous but is not a critical or necessary cellular construction. Instead, cells of other configurations may be used, and the cells of the hexagonal honeycomb may be in fact modified in accordance with the invention to accommodate special component sizes and shapes. Aluminum is the preferred material because it is light, inexpensive and has the desired thermal, electrical and mechanical characteristics. However, stainless steel, copper, brass and many other materials may be used singly or in combination.

It is readily apparent that with the construction of the invention the only restraints on movement of components which must be overcome in removing or inserting a component are the snug fit between the components 24 and the encompassing cell walls 15 and the welded connections at one or both ends which are made between the ribbon connectors 27 and the component leads 25. If a particular component 24 is identified as being defective during testing or operation, therefore, it may be easily removed and a new one substituted. Like substitutions may be made even if the modules are to be employed in mobile or other systems which are subject to a great amount of vibration and mechanical stress. For such applications the techniques described below may be employed to obtain good mechanical adherence without disturbing the desirable properties or unduly complicating the installation.

Figure 3:
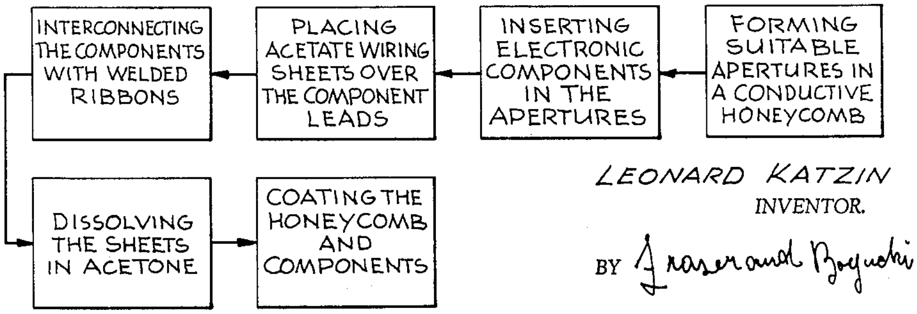
FIG. 3 is a block diagram representation of the steps of a method of fabricating a circuit assembly in accordance with the present invention.

In accordance with one aspect of the method of the invention, illustrated diagrammatically in FIG. 3, the individual honeycomb 14 of a module is prepared for the insertion of various-sized components by the use of a cutting tool. A convenient cutting tool may comprise a simple hand-held cylinder having a tapered internal surface and a diameter slightly smaller than the typical cell diameter. By severing the strip between two adjacent weld lines, or by cutting a number of strips about a weld line simultaneously, this single tool may be used to fashion a wide range of cell sizes. Proper placement of the tool may be conveniently indicated by placing an appropriately apertured template over the broad face of the honeycomb, or by indicating marks on the side face of the honeycomb. Loose ends of the strip material are readily bent out of the way, and the sides of the cell walls distort to receive a component with a snug fit as it is entered by hand or mechanically. In instances where volume of production permits, a suitable multi-element die may be employed simultaneously to form all of the different sizes of apertures in the honeycomb.

Thereafter, with each of the components in position, sheets bearing indicia denoting the interconnections to be made between the separate components are placed over the extending leads on each side of the honeycomb. The sheets are preferably acetate, upon which the desired patterns have been recorded photographically. After ribbon conductors have been welded between the various terminal leads in the desired patterns, the acetate sheets may be removed simply by washing the assembly or by dipping the sheets alone in acetone to dissolve the sheets. The module is then again completely open and may be used as indicated above. The components and the honeycomb may then be coated with a resin without blocking the cells of the honeycomb, in order to further unify the structure while permitting the continued flow of coolant. Where a great many different components are used and the interconnections are numerous, it may be desired to use more than one sheet on each side, and to build up layers of connectors. In this event, the connectors are readily placed in planes which lie normal to the selected axis.

Although there have been described above and illustrated in the drawings various assemblies and methods for providing electronic circuit modules, it will be appreciated that the invention is not limited thereto. Accordingly, the invention should be considered to include all alternative modifications and variations falling within the scope of the appended claims.

I claim:

1. A support member for intercoupled electronic components,
- the support member having a thin-walled cellular configuration with cells regularly disposed throughout the member, the cells defining apertures for receiving the electronic components and extending in a honeycomb structure substantially throughout the cellular portion of the support member,
- the cell walls of the support member being deformable to provide areal contact with electronic components which may be inserted, and thermal conductive paths and a common electrical connection connected to the cell walls.

2. A support member for intercoupled electronic components,
- the support member having a cellular honeycomb structure with thin cell walls defining deformable apertures extending substantially throughout the cellular portion of the support member for receiving the electronic components,
- at least one electronic component inserted within a deformable aperture between adjacent cell walls,
- the cell walls of the support member providing areal contact with electronic components received within the apertures.

3. A support member for intercoupled electronic components,
- the support member being defined by thin, individually deformable strips having a relatively high thermal and electrical conductivity and disposed to define individual cells of a honeycomb configuration,
- each of the cells being aligned substantially parallel with a common axis, and being deformable to receive individual components of varying cross-sectional sizes and shapes,
- and the cells providing individual encompassing support means, a heat sink and a common electrical connection for the electronic components.

4. A modular electronic construction including:
- a cellular thermally and electrically conductive body providing a convective heat path therethrough, the body having thin, deformable cell walls defining apertures initially regularly disposed throughout the body in a honeycomb structure;
- a plurality of components, each positioned substantially centrally within an aperture defined by the cell walls of the cellular body and having terminals extending oppositely therefrom;

and means coupling the terminals of the components in a predetermined configuration.

5. An electronic assembly including the combination of:

a number of individual electronic circuit modules, each including a body formed by thin strips defining a number of initially regularly spaced internal cells which are substantially parallel to a selected axis and permeable to the flow of a cooling fluid;

a number of individual electronic components positioned within apertures defined by the cells of the individual modules, the lengths of the component bodies lying substantially parallel to the selected axis;

first interconnecting means coupling components within the individual modules, the first interconnecting means extending along planes normal to the selected axis;

second interconnecting means coupling the different modules, the second interconecting means being positioned in planes substantially parallel to the selected axis;

and means for passing a cooling fluid through the cells in a direction substantially parallel to the selected axis.

6. An electronic assembly having high component density and including the combination of:

a number of individual circuit modules, each of the modules including support bodies of substantially rectangular outline defined by deformable strips of thermally and electrically conductive material defining initially regularly disposed cells which are open relative to a selected axis, each of the modules also including a plurality of components mounted in the apertures defined by deformed cells, the lengths of the bodies of the components being substantially parallel to the selected axis and the terminal leads of the components extending from the bodies in opposite directions, the individual modules also including welded ribbon interconnections between the individual components of the modules, the welded ribbons extending between terminal leads of the selected components and lying in planes which are substantially normal to the selected axis;

means lying in planes which are substantially parallel to the selected axis for intercoupling the different circuit modules;

and means for passing air through the cells of the modules in the assembly, thereby to provide cooling through passage of the air in heat exchange relationship with the components and with conductively heated portions of the cellular body.

7. A compact, lightweight, mechanically rigid electronic module body, including:

a rectangular support structure defined by thin, relatively wide, high thermal conductivity and high electrical conductivity strips which are welded together along selected regions in a honeycomb cellular structure with the cells lying substantially normal to the end faces of the structure, the cells being deformable outwardly from a selected size to receive electrical components in thermal heat exchange relation, and with means electrically connected in common about the periphery of the rectangular support structure, and the cells providing apertures for the passage of cooling fluids.

8. An electronic modular assembly including:

a cellular heat dissipative and electrically conductive thin-walled honeycomb body having thin deformable walls initially defining regularly spaced openings arranged to receive individual components in individual apertures thereof, the honeycomb body extending substantially throughout the cellular portion of the assembly;

a plurality of components, each positioned within a different aperture of the body, and each having terminals extending in opposite directions substantially parallel to a selected axis;

and conductive means electrically intercoupling the extending terminals of the components in a predetermined pattern.

9. An electronic modular assembly including:

a central body having a generally rectangular configuration and formed of relatively thin strips of electrically conductive material having relatively high thermal conductivity and being readily shearable, the strips being welded together into a cellular honeycomb configuration, such that individual deformable regularly spaced cells are definable throughout the body for snugly receiving the bodies of individual electrical components, the cellular body having relatively flat faces defined by the opposite edges of the strips, and the cells being open in the direction normal to the flat faces, such that cooling fluid may pass therethrough;

a plurality of electrical components, the electrical components having bodies at least partially within the cells in which they register and in contacting relation with the walls thereof, and at least one terminal lead extending at least partially beyond the broad faces of the cellular body;

a plurality of conductive ribbons, each of the ribbons coupling together a selected pair of terminals of different electrical components, and each having a welded connection to each of the terminals;

a conductive outer wall encompassing the cellular body and providing an outer frame therefor;

and a connector plug coupled to one side of the outer frame, the connector plug including a number of male inserts and being electrically coupled to selected ones of the terminals of the components.

10. The method of providing an electronic circuit modular assembly which includes the steps of:

inserting electrical components in selected separate cells of an aluminum honeycomb body, with the terminal leads of the components extending out beyond the broad faces of the honeycomb;

placing acetate sheets over the extended leads of the components at each broad face of the honeycomb, each of the sheets bearing indicia denoting wiring connections to be made between specified component leads;

welding ribbon conductors between the different leads in accordance with the indicia thereon;

dissolving the acetate sheets in acetone;

and coating the components and the honeycomb with a resin without blocking the cells of the honeycomb.

11. The method of providing an electronic circuit module which includes the steps of:

inserting electrical components in separate cells of a cellular structure, with the leads of the components extending substantially normal to at least one selected plane;

placing a sheet over the extended leads, the sheet bearing indicia denoting wiring interconnections to be made;

forming the interconnections in accordance with the indicia;

and removing the sheet to leave the cellular construction and the exposed components.

12. The method of providing an electronic circuit modular assembly which includes the steps of:

providing a welded, relatively thick, honeycomb structure of a readily shearable material;

shearing the material of the honeycomb to provide cells of selected sizes therein;

inserting the bodies of electrical components into the cells thus formed, with snug fits thereto;

and joining selected ones of the components electrically in a predetermined pattern to provide an open construction.

References Cited by the Examiner

UNITED STATES PATENTS

| | | | |
|---|---|---|---|
| 2,895,087 | 7/59 | Lieb et al. | 317—101 |
| 2,906,016 | 9/59 | Cannon et al. | 29—155.5 |
| 2,963,577 | 12/60 | Errichiello et al. | 317—101 |
| 2,974,263 | 3/61 | Akins | 317—100 |
| 3,030,553 | 4/62 | Comuntzis | 317—100 |
| 3,052,749 | 9/62 | Snapp et al. | 317—101 |

OTHER REFERENCES

German printed application 1,088,561, Sept. 8, 1960.

LARAMIE E. ASKIN, *Primary Examiner*.

JOHN F. BURNS, *Examiner*.